United States Patent [19]

Kuroda et al.

[11] Patent Number: 5,260,567
[45] Date of Patent: Nov. 9, 1993

[54] CANTILEVER UNIT AND ATOMIC FORCE MICROSCOPE, MAGNETIC FORCE MICROSCOPE, REPRODUCING APPARATUS AND INFORMATION PROCESSING APPARATUS USING THE CANTILEVER UNIT

[75] Inventors: Ryo Kuroda, Tokyo; Katsunori Hatanaka, Yokohama; Toshihiko Miyazaki, Hiratsuka; Takayuki Yagi, Tokyo; Toshimitsu Kawase, Atsugi; Katsuhiko Shinjo, Isehara, all of Japan

[73] Assignee: Canon Kabushiki Kaisha, Tokyo, Japan

[21] Appl. No.: 865,227

[22] Filed: Apr. 8, 1992

[30] Foreign Application Priority Data

Apr. 10, 1991 [JP] Japan ................................. 3-103634

[51] Int. Cl.$^5$ ............................................... H01J 5/16
[52] U.S. Cl. ................................. 250/227.19; 385/13; 250/306
[58] Field of Search ............... 250/227.19, 306, 307, 250/491.1, 442.11, 423 F; 356/358; 385/12, 13; 73/105

[56] References Cited

U.S. PATENT DOCUMENTS

| | | | |
|---|---|---|---|
| 3,837,728 | 9/1974 | Logan et al. | 385/8 |
| 4,717,255 | 1/1988 | Ulbers | 356/358 |
| 4,724,318 | 2/1988 | Binnig | 250/307 |
| 4,744,661 | 5/1988 | Ulbers et al. | 385/13 |
| 4,865,453 | 9/1989 | Gidon et al. | 356/358 |
| 4,906,840 | 3/1990 | Zdeblick et al. | 250/442.11 |
| 4,912,822 | 4/1990 | Zdelblick et al. | 250/442.11 |
| 4,998,016 | 3/1991 | Nose et al. | 250/306 |
| 5,091,983 | 2/1992 | Lukosz | 385/13 |
| 5,141,319 | 8/1992 | Kajimura et al. | 356/358 |
| 5,155,715 | 10/1992 | Ueyama et al. | 250/307 |

FOREIGN PATENT DOCUMENTS

| | | |
|---|---|---|
| 0286528 | 5/1988 | European Pat. Off. . |
| 0262253 | 6/1988 | European Pat. Off. . |
| 3718192 | 8/1988 | Fed. Rep. of Germany . |
| WO89/07256 | 8/1989 | PCT Int'l Appl. . |

OTHER PUBLICATIONS

"Atomic Force Microscope" by G. Binnig et al.; Physical Review Letters; vol. 56, No. 9, Mar. 3, 1986 pp. 930-933 published by The American Physical Society.
"Compact Interferometric Force Sensor", IBM Technical Disclosure Bulletin, vol. 32, No. 2, Jul. 1, 1989, New York USA; pp. 416-417.
"Optical Atomic Force Sensor" IBM Technical Disclosure Bulletin, vol. 32, No. 3A, Aug. 1, 1989, New York USA; pp. 241-242.
"Scanning probe microscopy: Current status and future trends" by H. K. Wickramasinghe; Journal of Vacuum Science and Technology, Part A. vol. 8 No. 1, Jan. 1, 1990 New York USA; pp. 363-368.

*Primary Examiner*—David C. Nelms
*Assistant Examiner*—Stephone B. Allen
*Attorney, Agent, or Firm*—Fitzpatrick, Cella, Harper & Scinto

[57] ABSTRACT

A cantilever unit comprises a cantilever for supporting a probe and a displacement amount detecting means, the displacement amount detecting means being integrated with the cantilever. An information processing apparatus comprises the cantilever unit and optionally an information recording medium stationed in close vicinity to the unit, wherein an information in the medium is reproduced at a signal on the basis of an displacement amount of the cantilever. An atomic force microscope and magnetic force microscope comprise the cantilever unit, respectively.

35 Claims, 5 Drawing Sheets

CANTILEVER UNIT AND ATOMIC FORCE MICROSCOPE, MAGNETIC FORCE MICROSCOPE, REPRODUCING APPARATUS AND INFORMATION PROCESSING APPARATUS USING THE CANTILEVER UNIT

BACKGROUND OF THE INVENTION

1. Field of the Invention

The present invention relates to a cantilever unit in which a cantilever and a displacement amount detecting means for it are integrated into one unit to attain a reduction in size, and to an atomic force microscope (hereinafter referred to simply as "AFM") which uses such a cantilever unit to measure the three-dimensional surface configuration of a specimen in nanometer scale. Further, the present invention relates to a reproducing apparatus and an information processing apparatus utilizing such an AFM.

2. Related Background Art

An AFM detects an atomic force acting between a specimen and a probe brought close to the surface of the specimen, up to a position at a distance of 1 nm or less therefrom, on the basis of the flexibility amount (the displacement amount) of a cantilever (an elastic body) supporting the probe, and makes it possible to observe the three-dimensional surface configuration of the specimen at a resolution of 1 nm or less by scanning the specimen surface while controlling the distance between the specimen and the probe in such a manner as to maintain this atomic force constant (Binnig et al., "Phys. Rev. Lett." 56, 930 (1986)). Unlike a scanning tunneling microscope (hereinafter referred to simply as "STM"), the AFM does not require the specimen to be conductive, so that it allows observation in atomic or molecular order of the surface of insulating specimens, in particular, the surface of semiconductor resists, biopolymers or the like. Thus, the AFM is expected to find a wide range of application.

FIGS. 5 and 6 show conventional AFMs. Basically, an AFM is composed of a probe 111 opposed to the specimen surface, a cantilever 107 supporting the probe, a means for detecting the amount of displacement of the cantilever due to the atomic force acting between the specimen and the probe, and a means for three-dimensionally controlling the relative position of the specimen with respect to the probe.

In the conventional AFM shown in FIG. 5, the detection of cantilever displacement amount is effected by an optical lever method according to which a light beam is applied from behind the cantilever 107, obtaining the displacement amount from the shift amount of the position of the reflected-light spot. In the conventional AFM shown in FIG. 6, a tunnel-current method is adopted, according to which a conductive probe 602 is arranged behind the cantilever 107 at a position close to it, and position control is performed on the conductive probe 602 in such a manner that the tunnel current flowing between the cantilever 107 and the conductive probe 602 is maintained constant, obtaining the displacement amount of the cantilever from the position control amount.

However, the optical lever method, described above, requires an adjusting jig for causing the light beam to be applied to the back surface of the cantilever, an optical component such as a lens 502 or a mirror, and a position adjusting jig for a half-split photodiode 504. The tunnel current method requires a jig for adjusting the position of the conductive probe 602 with respect to the back surface of the cantilever. Thus, in both methods, the mechanical structure of the cantilever displacement amount detecting means has to be rather large and complicated. As a result, the mechanical structure of the displacement amount detecting means is subject to positional deviation due to disturbances such as floor vibration, acoustic vibration, or temperature drift, or to generation of resonance due to deterioration in rigidity, thus making it difficult for the detection of the cantilever displacement amount to be effected at a satisfactory level of resolution.

SUMMARY OF THE INVENTION

It is an object of the present invention to provide a cantilever unit in which the cantilever displacement amount detecting means is integrated with the cantilever and which is little subject to the influence of disturbances.

Another object of the present invention is provide an AFM which uses such a novel cantilever unit and which requires no relative positioning and is little subject to the influence of disturbances. Still another object of the present invention is to provide a reproducing apparatus utilizing this AFM to reproduce information recorded on a recording medium, as well as an information processing apparatus in which this AFM is combined with an STM.

In a first aspect of the present invention, there is provided a cantilever unit comprising a cantilever for supporting a probe and a displacement amount detecting means, which displacement amount detecting means is integrated with the cantilever.

In a second aspect of the present invention, there is provided an information processing apparatus, comprising a cantilever unit according to the first aspect of the present invention.

In a third aspect of the present invention, there is provided an information processing apparatus, comprising a cantilever unit according to the first aspect of the present invention and an information recording medium stationed in close vicinity to said unit, wherein an information in the medium is reproduced at a signal on the basis of an displacement amount of the cantilever.

In a fourth aspect of the present invention, there is provided an atomic force microscope comprising a cantilever unit according to the first aspect of the present invention.

In a fifth aspect of the present invention, there is provided a magnetic force microscope comprising a cantilever unit according to the first aspect of the present invention.

In accordance with the present invention, the optical-integrated-circuit technique is utilized to optically integrate a light source, an optical waveguide, a waveguide-type optical-path changing device and a photodetector into one integral detection unit, which is integrated with a cantilever, thereby making it possible to reduce the size of the displacement detecting means to 1/50 or less as compared to that used in conventional AFMs. Accordingly, the resonance frequency of the detecting means can be increased to a value several tens times larger than that in the conventional AFMs, thus rendering the detecting means little subject to the influence of disturbances.

More specifically, optical components, such as a light source, an optical waveguide, a lens for condensing the light in the optical waveguide, a beam splitter for dividing or synthesizing a light beam, a mirror for turning the direction of light, and optical parts such as a coupler for extracting light out of the waveguide, a photodiode for detecting light quantity, a photoelectric-current amplifying circuit, a signal processing circuit, etc. are integrated into one unit, which is integrated with a cantilever.

DETAILED DESCRIPTION OF THE PREFERRED EMBODIMENTS

The present invention will now be described in more detail with reference to embodiments thereof.

First Embodiment

Figure 1:
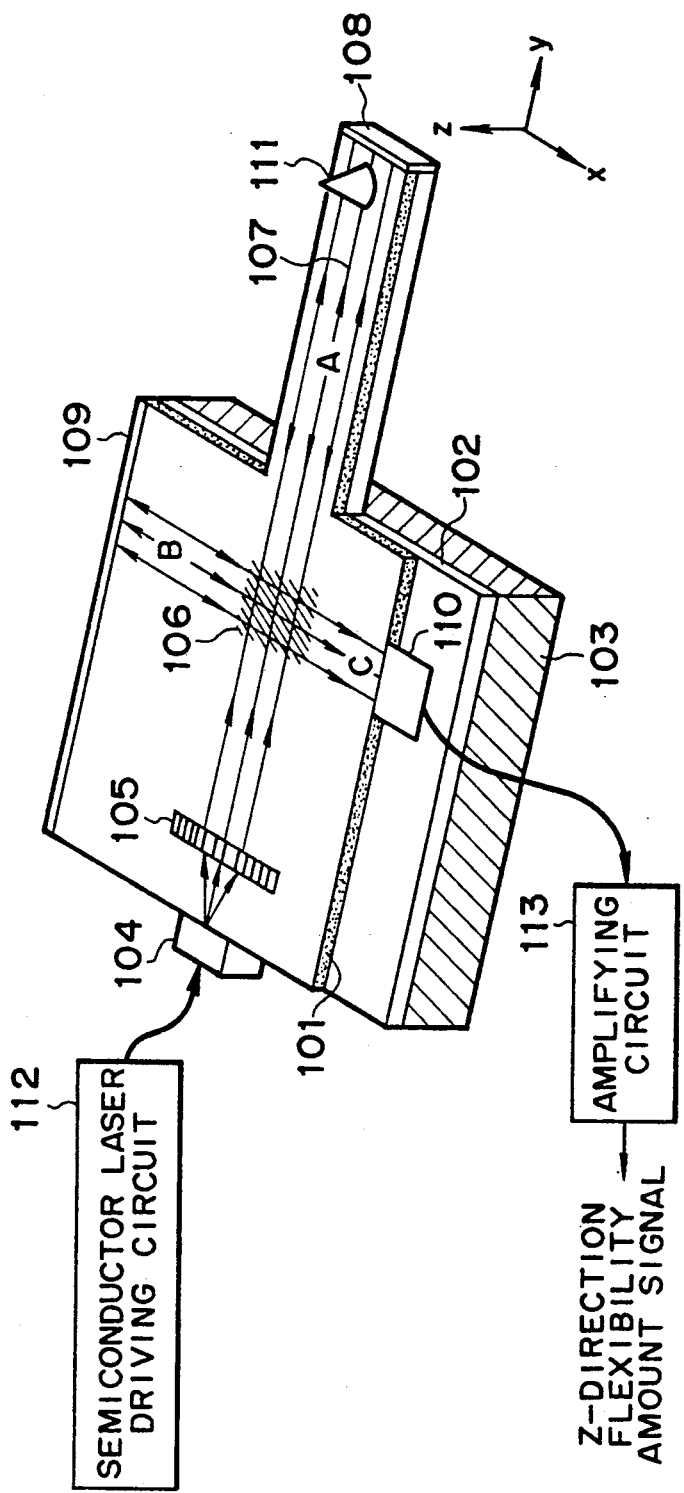
FIG. 1 is a diagram showing the construction of an optically integrated cantilever unit according to a first embodiment of the present invention.

FIG. 1 shows the construction of a cantilever unit according to an embodiment of the present invention.

The cantilever unit shown includes a film optical waveguide 101, an SiO$_2$ layer 102, an Si substrate 103, a semiconductor laser 104, a Fresnel lens 105, a grating beam splitter 106, a cantilever 107, a reflecting mirror (a) indicated at 108, a reflecting mirror (b) indicated at 109, a photodiode 110, a probe 111, a semiconductor laser driving circuit 112, and an amplifying circuit 113.

In this embodiment, the semiconductor laser 104 is joined to one end surface of the SiO$_2$/Si substrate 103, on the surface of which is formed the film optical waveguide 101, and serves to introduce a laser beam into the optical waveguide 101. The introduced laser beam is collimated by the Fresnel lens 105, and is then separated into two rays in different directions by the grating beam splitter 106. One of the rays, indicated by the symbol A, passes through the optical waveguide provided on the surface of the cantilever 107 that is provided on the other end surface of the Si substrate 103, and is reflected by the reflecting mirror (a), 108, which is provided on the free-end surface of the cantilever 107, to pass backwards through the optical waveguide on the surface of the cantilever 107 before it enters the grating beam splitter 106 again.

The other ray of light, indicated by the symbol B, whose course has been turned by 90°, is reflected by the reflecting mirror (b), 109, and is transmitted through the same course backwardly before it enters the grating beam splitter 106 again. The two rays are then synthesized by the grating beam splitter 106 into a synthesized light C, which is detected by the photodiode 110. When the probe 111 provided on the cantilever 107 detects an atomic force to cause the tip end section of the cantilever 107 to be flexed in the Z-direction in the drawing, a distortion corresponding to the displacement amount $\Delta Z$ is generated in the optical waveguide on the surface of the cantilever 107, thereby changing the refractive index of the optical waveguide. Assuming that this change in refractive index is $\Delta n$, $\Delta Z = c\Delta n$ (where c is a constant), and a change of $2L\Delta n$ (where L represents the length of the cantilever) is generated in the optical path difference between the ray of light A, which passes through the surface layer of the cantilever 107, and the ray of light B, which is reflected by the reflecting mirror 109, resulting in a change in the luminous intensity of the synthesized light C. Therefore, by detecting this change in luminous intensity, it is possible to detect the displacement amount in the Z-direction, $\Delta Z$, of the tip end section of the cantilever 107. A signal indicative of this change in luminous intensity is amplified by the amplifying circuit 113 to become a Z-direction displacement signal. Assuming that the elastic constant in the Z-direction of the cantilever 107 is k, the magnitude f of the atomic force detected by the probe 111 can be obtained by the equation: $f = k\Delta Z$.

A method of preparing such an optically integrated cantilever unit will now be described.

A PiN photodiode is formed on an Si substrate by the usual silicon processing. Then, a protective Si$_3$N$_4$ film having a thickness of 0.1 μm is formed thereon by the LPCVD method. Next, after forming an SiO$_2$ film having a thickness of 0.5 μm by thermal oxidation on other opening sections, the Si$_3$N$_4$ film is removed by plasma etching. Subsequently, an As$_2$S$_3$ film optical waveguide having a thickness of 1 μm is formed on the SiO$_2$ film by vacuum evaporation, and, by utilizing the change in refractive index by electron beam irradiation, a Fresnel lens and a grating beam splitter are formed in the optical waveguide. After patterning of configuration of a cantilever, anisotropic etching is performed from the back side of the substrate by using KOH solution, thereby forming the cantilever. Then, a probe is provided at the tip end of the cantilever by the electron beam deposition method. After performing cleavage on the chip thus obtained, a metal such as Al is deposited on one end surface thereof and on a side surface of the tip end portion of the cantilever to form reflecting mirrors, and a semiconductor laser is joined to the other end surface.

Figure 2:
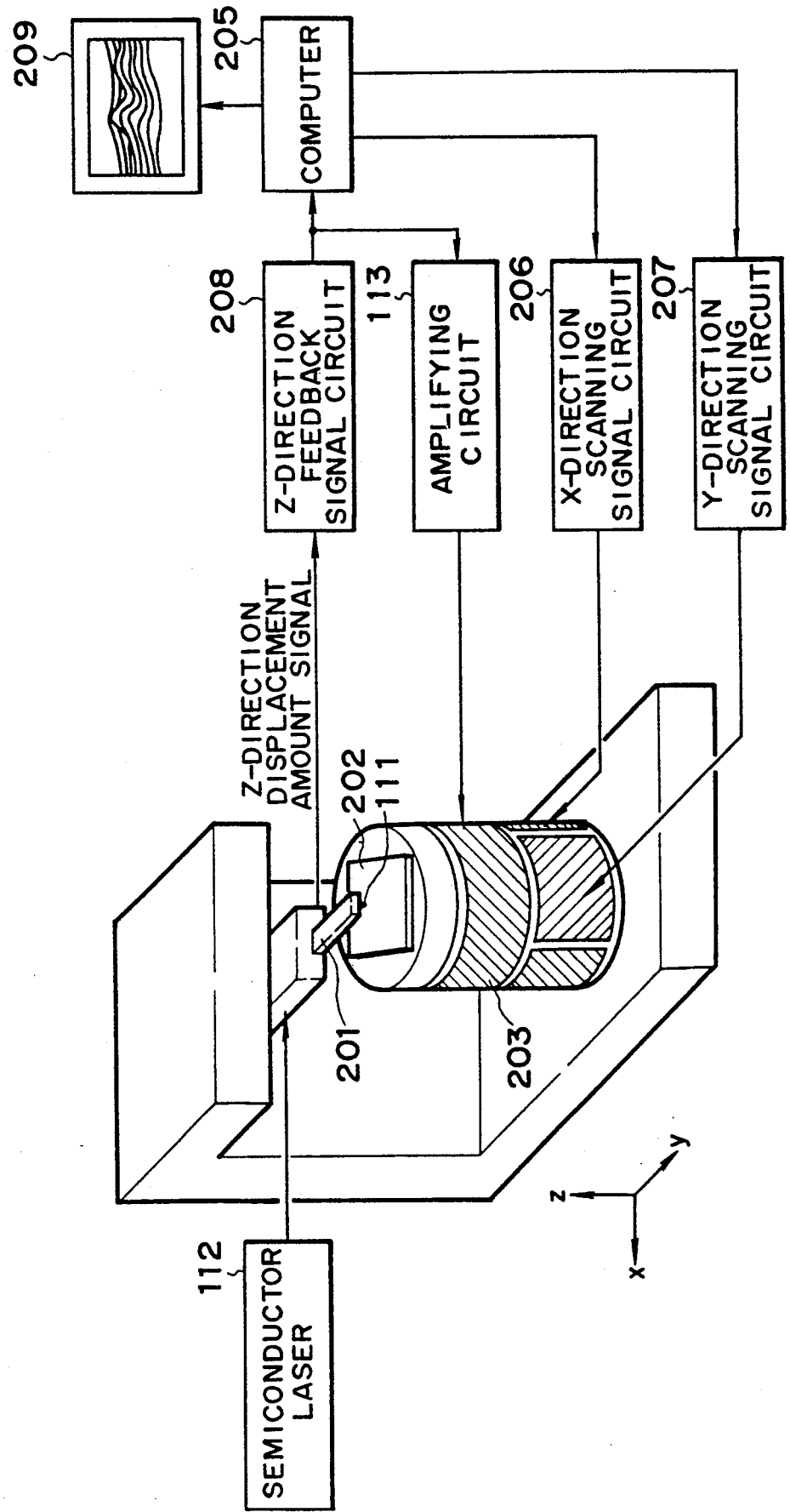
FIG. 2 is a diagram showing the construction of an atomic force microscope using the optically integrated cantilever unit according to the first embodiment of the present invention.

Next, the AFM of the present invention, constructed by using the optical integrated cantilever unit shown in FIG. 1, will be described with reference to FIG. 2. A specimen 202 opposed to cantilever unit 201 of the type shown in FIG. 1 is brought near to the probe 111 of the unit by means of an XYZ-drive device 203, up to a position at a distance of 1 nm or less therefrom. Due to the atomic force acting between the probe 111 and the surface of the specimen 202, a deflection is generated in the cantilever. A Z-direction feedback signal is supplied to the XYZ-drive device 203 such that the amount of this deflection is kept constant (i.e., the atomic force is kept constant), thereby controlling the distance between the probe 111 and the specimen 202. Further, a scanning signal is supplied from a computer 205. On the basis of this scanning signal, an X-direction scanning signal and a Y-direction scanning signal are supplied to the XYZ-drive device 203 by an X-direction scanning signal circuit 206 and a Y-direction scanning signal circuit 207, respectively, thereby scanning the specimen 202 in the XYZ-dimensions relative to the probe 111. In this process, it is possible to detect the depth or height of the surface irregularities from the Z-direction feedback signal for keeping the deflection amount of the cantilever constant. In the computer 205, two-dimensional distribution data on the surface irregularities is obtained. The data is displayed on a display 209. When a magnetic substance, such as Fe, Co or Ni, is used here as the material of the probe, a magnetic force microscope is obtained, which makes it possible to observe the magnetic domain structure of the surface of a magnetic specimen.

Second Embodiment

Figure 3:
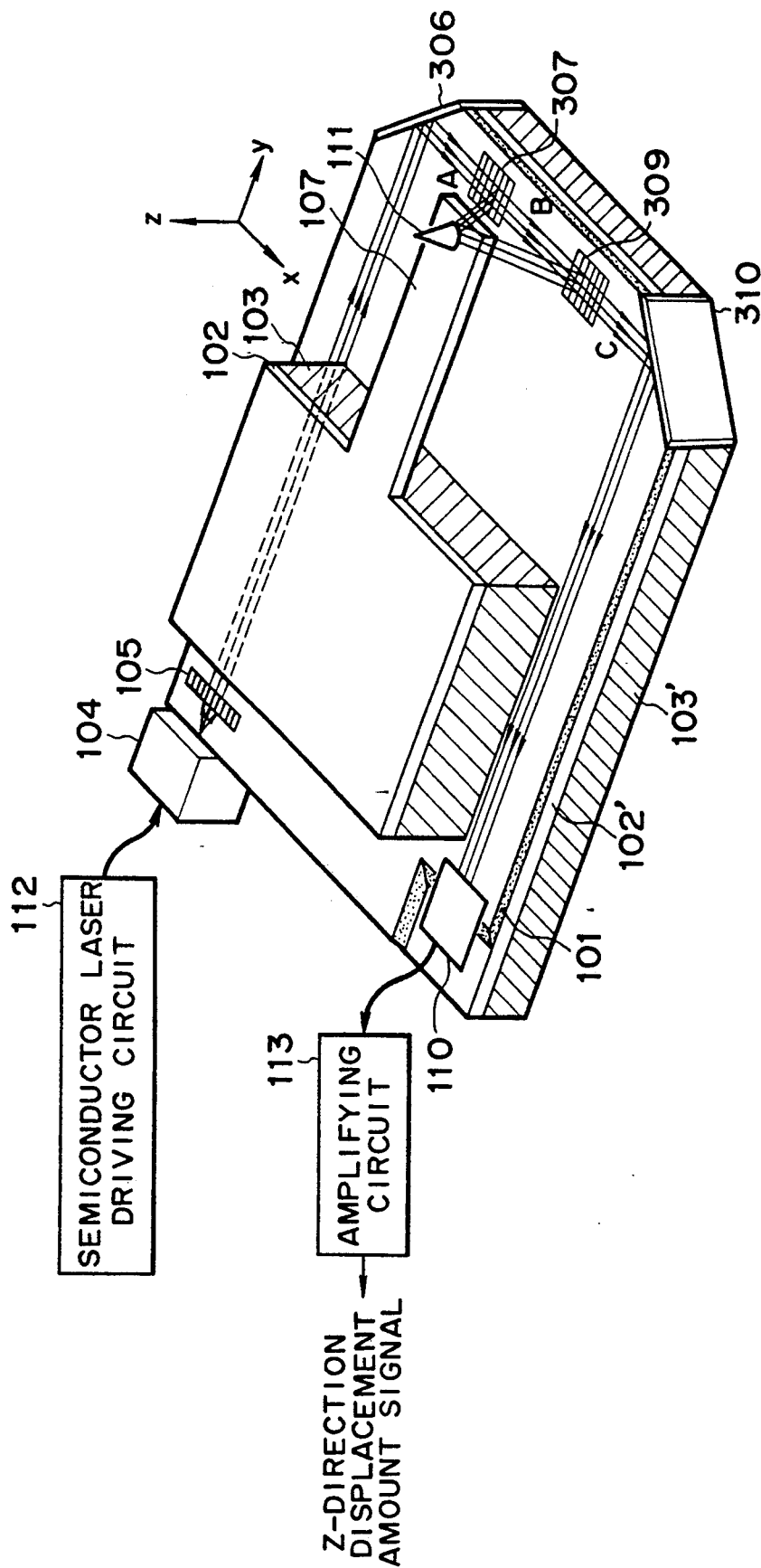
FIG. 3 is a diagram showing the construction of an optically integrated cantilever unit according to a second embodiment of the present invention.

FIG. 3 shows the construction of an optically integrated cantilever unit according to a second embodiment of the present invention. The cantilever unit shown includes an $SiO_2/Si$ substrate (102'/103') having on its surface a film optical waveguide 101, into which a laser beam is introduced from a semiconductor laser 112 joined to one end surface of the substrate. The laser beam introduced is collimated by a Fresnel lens 105, and is then reflected by a reflecting mirror (c) indicated at 306 before it enters a grating coupler (a) indicated at 307. In the grating coupler (a), 307, part of the light is extracted out of the optical waveguide, as indicated by the symbol A, and is reflected by the back surface of the cantilever 107. After that, the part of the light returns to the optical waveguide at a grating coupler (b), indicated at 309, to be synthesized with the ray of light B which has been propagated through the optical waveguide, thus becoming a synthesized light C, which is reflected by a reflected mirror (d), indicated at 310, and then detected by the photodiode 110. When the probe 111 provided on the cantilever 107 detects an atomic force and causes the tip end section of the cantilever 107 to be deflected in the Z-direction in the drawing, there is generated, in accordance with the displacement amount $\Delta Z$ of the cantilever, a change in the length of the optical path through which the light portion A, extracted out of the optical waveguide at the grating coupler (a), 307, returns to the optical waveguide at the grating coupler (b), 309. Assuming that this change is $\Delta E$, there is generated, in the optical path difference between the light A extracted out of the optical waveguide and the light B which has been propagated through the optical waveguide, a change $\Delta E = 2(1-n\cdot\sin\theta)\Delta Z/\cos\theta$ (where $\theta$ is the angle defined by the normal of the optical waveguide surface and the outgoing light A, and n is the refractive index of the optical waveguide), thereby causing the luminous intensity of the synthesized light C to change. Therefore, by detecting this change in luminous intensity, it is possible to detect the displacement amount $\Delta Z$ in the Z-direction of the tip end section of the cantilever 107. A signal indicative of this change in luminous intensity is amplified by the amplifying circuit 113 to become a Z-direction displacement amount signal. Assuming that the elastic constant in the Z-direction of the cantilever 107 is k, the magnitude f of the atomic force detected by the probe 111 can be obtained from the equation: $f = k\Delta Z$.

Next, a method of producing the optical integrated cantilever unit of this embodiment will be described.

A PiN photodiode is formed on an Si substrate by the usual silicon processing. Then, a protective $Si_3N_4$ film having a thickness of 0.1 $\mu m$ is formed thereon by the LPCVD method. Next, after forming an $SiO_2$ film having a thickness of 2.5 $\mu m$ by thermal oxidation on other opening sections, the $SiO_2$ film is removed by plasma etching. Subsequently, a glass-film optical waveguide of 7059 Glass (manufactured by Corning) having a thickness of 2 $\mu m$ is formed on the $SiO_2$ film by high-frequency sputtering, and, by utilizing the change in refractive index by ion exchange, ion implantation or the like, a Fresnel lens and grating couplers are formed. Then, a chip having a cantilever formed by patterning and anisotropic etching on another Si substrate is joined to the glass-film optical waveguide by anode bonding method. After performing cleavage and polishing on the chip, a metal such as Al is deposited on end surfaces thereof to form reflecting mirrors, and a semiconductor laser is joined to another end surface thereof.

Figure 4:
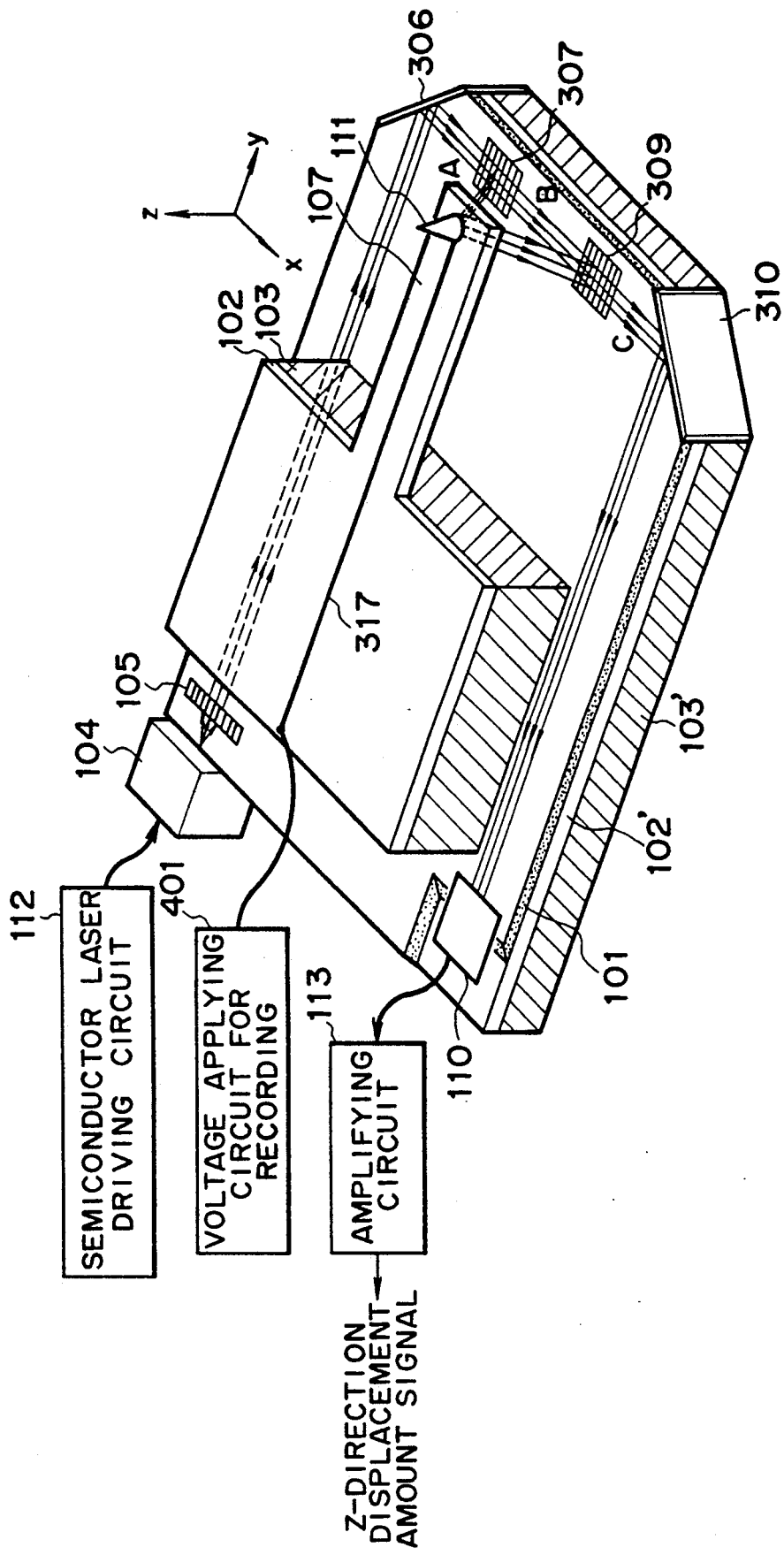
FIG. 4 is a diagram showing the construction of a cantilever unit applied to an information processing apparatus according to the other embodiment of the present invention.
Figure 5:
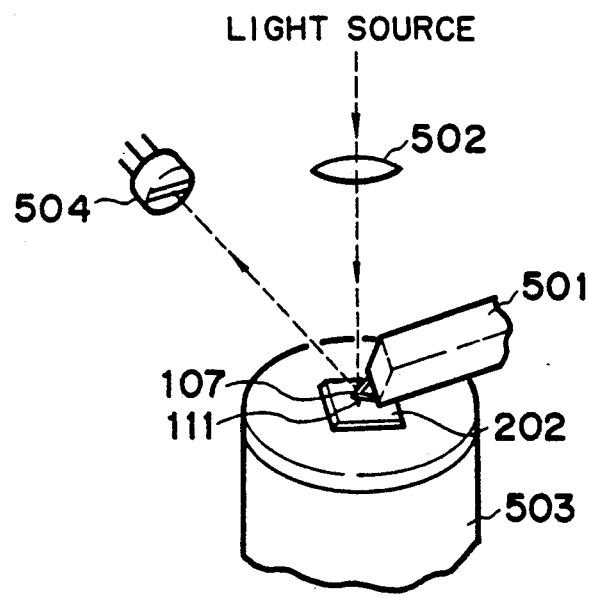
FIG. 5 is a diagram showing a prior-art example of a cantilever displacement amount detecting system in an atomic force microscope.
Figure 6:
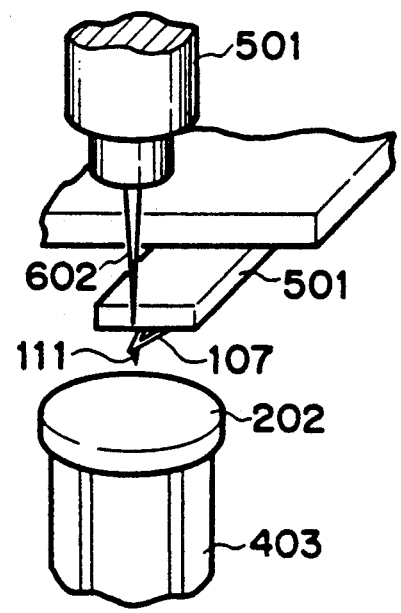
FIG. 6 is a diagram showing another prior-art example of a cantilever displacement amount detecting system in an atomic force microscope.

Referring to FIG. 4, embodiment of information processing (recording/reproducing) apparatus of the present invention will be described in the following. The same constitution of apparatus (not illustrated) as in the above FIG. 2 is employed in the present embodiment, too. In FIG. 4, probe 111 is formed of a conductive material. Further, the cantilever unit is arranged so that a tip of the probe is close to a desired position on the surface of the information recording medium (not illustrated), which corresponds to the specimen 202 in FIG. 2.

Voltage for recording is applied between probe 111 and the above-mentioned medium by voltage applying circuit for recording, to form a bit on the desired position of the above-mentioned medium. Reference numeral 317 indicates an Al wiring.

In the present invention, a material capable of changing a form of its own surface by current flowing through the part was employed as medium as mentioned above.

The operation reproducing the bits (information) recorded on the above-mentioned medium in such a manner is described below. The tip of the probe 111 is stationed in close vicinity to the surface of the above-mentioned medium, and the probe 111 is scanned in an x-y direction in the figure. When the tip of the probe 111 is made opposite to the above-mentioned bit, the tip is stressed according to the shape of the bit, whereby cantilever 107 is flexed. The amount of flexing is detected by the above-mentioned displacement amount detecting means in the cantilever unit of the present invention, to obtain the reproducing signal.

As mentioned above, the apparatus where the recording of information is done by application of the STM constitution and the reproducing of the information done by application of the AFM constituion was explained.

As described above, in accordance with this invention, the cantilever displacement amount detecting system is formed as an integrated unit, which is integrated with the cantilever, thereby providing the following advantages:

(1) No relative positioning of the cantilever and the displacement amount detecting system is needed, thus attaining an improvement in maneuverability; and (2) The apparatus as a whole can be reduced in size and rendered less subject to the influence of disturbances, thereby attaining an improvement in detecting resolution and making it possible to measure the three-dimensional surface configuration of a specimen with an AFM of higher accuracy and higher resolution.

What is claimed is:

1. A cantilever unit comprising a substrate, a cantilever having a fixed end and a free end, said fixed end being supported by said substrate and said free end being displaceable due to elastic distortion of said cantilever by application of a force thereto, an optical waveguide provided on said cantilever and said substrate, a light source for introducing a light beam into said optical waveguide, and means for detecting a change of the optical path of the light beam transmitted in said optical waveguide caused by a change of the refractive index of said optical waveguide due to elastic distortion of said cantilever.

2. A cantilever unit according to claim 1, wherein said light source is a semiconductor laser.

3. A cantilever unit according to claim 1, wherein said means for detecting a change of the optical path comprises a light synthesizer provided in said optical waveguide for synthesizing a light beam transmitted through the optical waveguide portion on said cantilever and a light beam transmitted only through the waveguide portion on said substrate, each light beam being introduced from said light source, and a photodetector provided in the optical waveguide for detecting a luminous intensity of the synthesized light outcoming from said light synthesizer and generating a luminous intensity signal to be utilized for determining the change of the optical path.

4. A cantilever unit according to claim 3, wherein said light synthesizer is an optical waveguide type grating.

5. A cantilever unit according to claim 3, wherein said photodetector is an optical waveguide type photodiode.

6. A cantilever unit according to any of claims 1-5, wherein said unit includes a signal processing circuit capable of calculating a change of the refractive index based on the detected change of the optical path, a magnitude of the elastic distortion based on the calculated change of the refractive index, and a magnitude of the force applied to said free end of the cantilever base don the calculated magnitude of the elastic distortion.

7. An atomic force microscope having a cantilever unit according to claim 6.

8. An information processing apparatus comprises a cantilever unit according to claim 6, a probe and wiring provided on said cantilever, said probe being formed of a conductive material and said wiring being connected to said probe, an information recording medium disposed in opposition to the tip of said probe, means for supplying a voltage for recording information, and means for reproducing information based on the magnitude of the force applied to said free end of the cantilever.

9. A magnetic force microscope having a cantilever unit according to claim 6.

10. A magnetic force microscope according to claim 9, wherein a probe formed of a magnetic material is provided on said cantilever.

11. A cantilever unit according to claim 6, wherein said signal processing circuit is integrated on said unit.

12. An atomic force microscope having a cantilever unit according to claim 11.

13. An information processing apparatus comprises a cantilever unit according to claim 11, a probe and wiring provided on said cantilever, said probe being formed of a conductive material and said wiring being connected to said probe, an information recording medium disposed in opposition to the tip of said probe, means for supplying a voltage for recording information, and means for reproducing information based on the magnitude of the force applied to said free end of the cantilever.

14. A magnetic force microscope having a cantilever unit according to claim 11.

15. A magnetic force microscope according to claim 14, wherein a probe formed of a magnetic material is provided on said cantilever.

16. A cantilever unit comprising a first substrate, a second substrate mounted on said first substrate, a cantilever having a fixed end and a free end, said fixed end being supported by said second substrate and said free end being displaceable due to elastic distortion of said cantilever by application of a force thereto, said cantilever being kept apart from said first substrate in the direction of the elastic distortion, an optical waveguide provided on said first substrate, a light source for introducing a light beam into said optical waveguide, a first coupler provide in the optical waveguide for capturing the light beam transmitted through the optical waveguide and projecting the captured light beam against the cantilever, a second coupler provided in the optical waveguide for reintroducing the light beam reflected from the cantilever, and means for detecting a change of the optical path of the light beam due to elastic distortion of said cantilever.

17. A cantilever unit according to claim 16, wherein said light source is a semiconductor laser.

18. A cantilever unit according to claim 16, wherein said first and second couplers are optical waveguide type grating couplers.

19. A cantilever unit according to claim 16, wherein said means for detecting a change of the optical path comprises a light synthesizer provided in the optical waveguide for synthesizing a first light beam and a second light beam, said first light beam being captured by the first coupler, then projected against and reflected from the cantilever and reintroduced into the optical waveguide by the second coupler, said second light beam being transmitted only through the optical waveguide, and a photodetector provided in the optical waveguide for detecting a luminous intensity of the synthesized light.

20. A cantilever unit according to claim 19, wherein said second coupler functions as said light synthesizer.

21. A cantilever unit according to claim 19, wherein said photodetector is an optical waveguide type photodiode.

22. An atomic force microscope having a cantilever unit according to any of claims 1-5 or 16-21.

23. A magnetic force microscope having a cantilever unit according to any of claims 1-5 or 16-21.

24. A magnetic force microscope according to claim 23, wherein a probe formed of a magnetic material is provided on said cantilever.

25. An information processing apparatus comprises a cantilever unit according to any of claims 1-5 or 16-21, a probe and wiring provided on said cantilever, said probe being formed of a conductive material and said wiring being connected to said probe, an information recording medium disposed in opposition to the tip of said probe, means for supplying a voltage for recording information, and means for reproducing information based on the magnitude of the force applied to said free end of the cantilever.

26. A cantilever unit according to any of claims 16-21, wherein said unit includes a signal processing circuit capable of calculating a magnitude of the elastic distortion based on the detected change of the optical path, and a magnitude of the force applied to said free end of the cantilever based on the calculated magnitude of the elastic distortion.

27. An atomic force microscope having a cantilever unit according to claim 26.

28. An information processing apparatus comprises a cantilever unit according to claim 26, a probe and wiring provided on said cantilever, said probe being formed of a conductive material and said wiring being connected to said probe, an information recording medium disposed in opposition to the tip of said probe, means for supplying a voltage for recording information, and means for reproducing information based on the magnitude of the force applied to said free end of the cantilever.

29. A magnetic force microscope having a cantilever unit according to claim 26.

30. A magnetic force microscope according to claim 29, wherein a probe formed of a magnetic material is provided on said cantilever.

31. A cantilever unit according to claim 26, wherein said signal processing circuit is integrated on said substrate.

32. An atomic force microscope having a cantilever unit according to claim 31.

33. An information processing apparatus comprises a cantilever unit according to claim 31, a probe and wiring provided on said cantilever, said probe being formed of a conductive material and said wiring being connected to said probe, an information recording medium disposed in opposition to the tip of said probe, means for supplying a voltage for recording information, and means for reproducing information based on the magnitude of the force applied to said free end of the cantilever.

34. A magnetic force microscope having a cantilever unit according to claim 31.

35. A magnetic force microscope according to claim 34, wherein a probe formed of a magnetic material is provided on said cantilever.

* * * * *

UNITED STATES PATENT AND TRADEMARK OFFICE
CERTIFICATE OF CORRECTION

PATENT NO. : 5,260,567
DATED : November 9, 1993
INVENTOR(S) : RYO KURODA, ET AL.

It is certified that error appears in the above-identified patent and that said Letters Patent is hereby corrected as shown below:

ON TITLE PAGE

In [56] References Cited, under U.S. PATENT DOCUMENTS:

"4,912,822  4/1990  Zdelblick et al." should read
--4,912,822  4/1990  Zdeblick et al.--; and
"5,155,715  10/1992  Ueyama et al." should read
--5,155,715  10/1992  Ueyema et al.--.

In [56] References Cited, under FOREIGN PATENT DOCUMENTS:

"0286528  5/1988  European Pat. Off." should read
--0286528  12/1988  European Pat. Off.--.

In [57] Abstract, Line 8, "an" should read --a--.

COLUMN 2

Line 20, "is" should read --is to--.
Line 44, "an" should read --a--.

UNITED STATES PATENT AND TRADEMARK OFFICE
CERTIFICATE OF CORRECTION

PATENT NO. : 5,260,567
DATED : November 9, 1993
INVENTOR(S) : RYO KURODA, ET AL.

It is certified that error appears in the above-identified patent and that said Letters Patent is hereby corrected as shown below:

COLUMN 7

Line 39, "base" should read --based on--.
Line 40, "don" should be deleted.

Signed and Sealed this

Twelfth Day of July, 1994

BRUCE LEHMAN

Attest:

Attesting Officer

Commissioner of Patents and Trademarks